United States Patent
Grinchuk et al.

(10) Patent No.: US 7,328,386 B2
(45) Date of Patent: Feb. 5, 2008

(54) METHODS FOR USING CHECKSUMS IN X-TOLERANT TEST RESPONSE COMPACTION IN SCAN-BASED TESTING OF INTEGRATED CIRCUITS

(75) Inventors: Mikhail I. Grinchuk, San Jose, CA (US); Ahmad A. Alyamani, Santa Clara, CA (US); Erik Chmelar, San Jose, CA (US)

(73) Assignee: LSI Logic Corporation, Milpitas, CA (US)

( * ) Notice: Subject to any disclaimer, the term of this patent is extended or adjusted under 35 U.S.C. 154(b) by 315 days.

(21) Appl. No.: 11/131,990

(22) Filed: May 18, 2005

(65) Prior Publication Data

US 2006/0282728 A1    Dec. 14, 2006

(51) Int. Cl.
*G01R 31/28*    (2006.01)

(52) U.S. Cl. .................................................... 714/726
(58) Field of Classification Search ................ 714/726
See application file for complete search history.

(56) References Cited

U.S. PATENT DOCUMENTS 7,200,784 B2 *    4/2007    Dervisoglu et al. .......... 714/731

* cited by examiner

*Primary Examiner*—James C. Kerveros
(74) *Attorney, Agent, or Firm*—Suiter Swantz PC LLO

(57) ABSTRACT

The invention relates to a method for using checksums in X-tolerant test response compaction in scan-based testing of integrated circuits. Flip-flops of a chip are treated as points of a discrete geometrical structure described in terms of points and lines, with each point representing a MUXed flip-flop holding a value, each line representing a checksum, and each set of parallel lines representing scan chains. The checksums for the flip-flops are calculated along a direction.

24 Claims, 8 Drawing Sheets

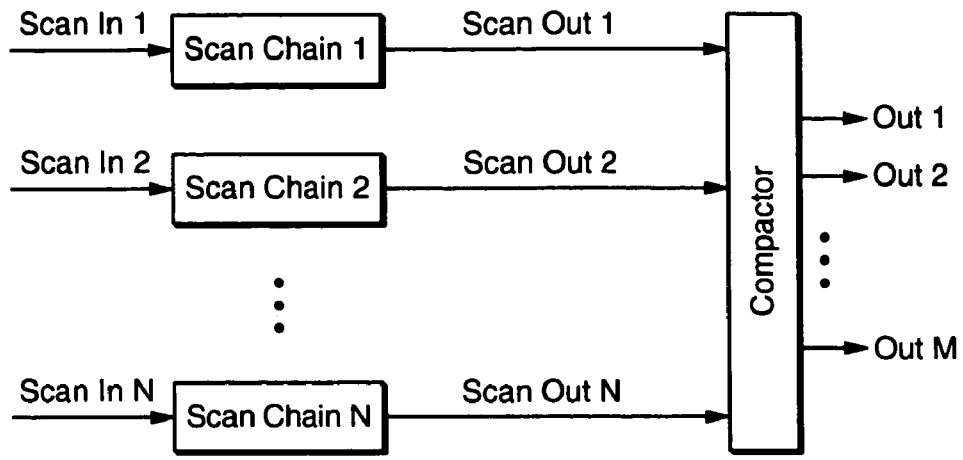
FIG._1
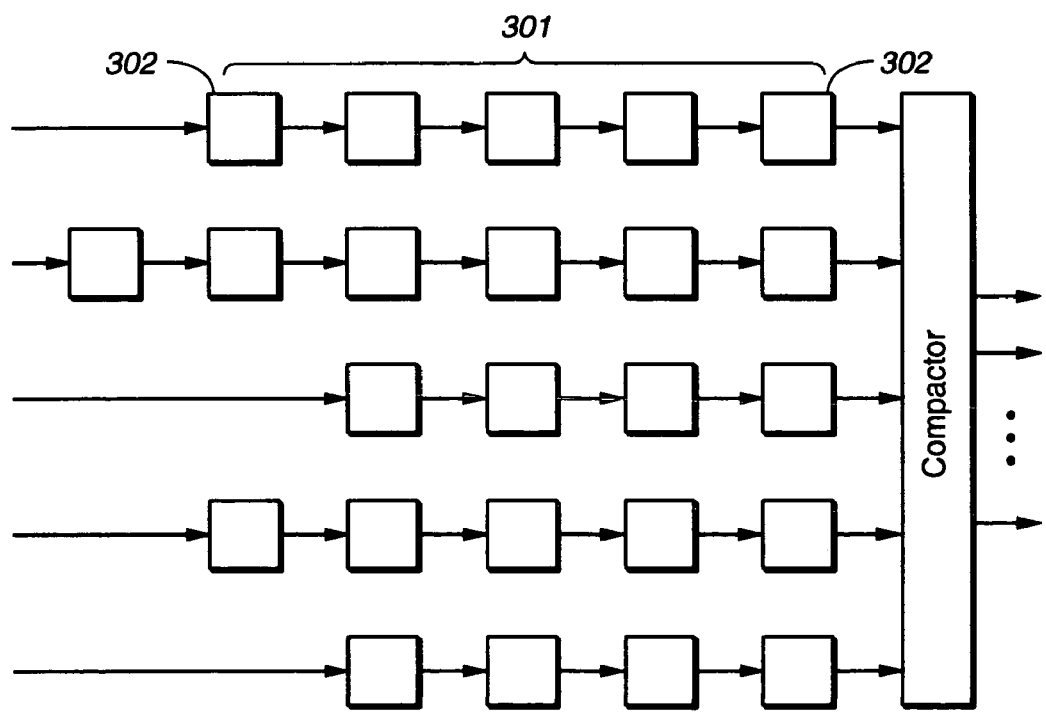
FIG._3

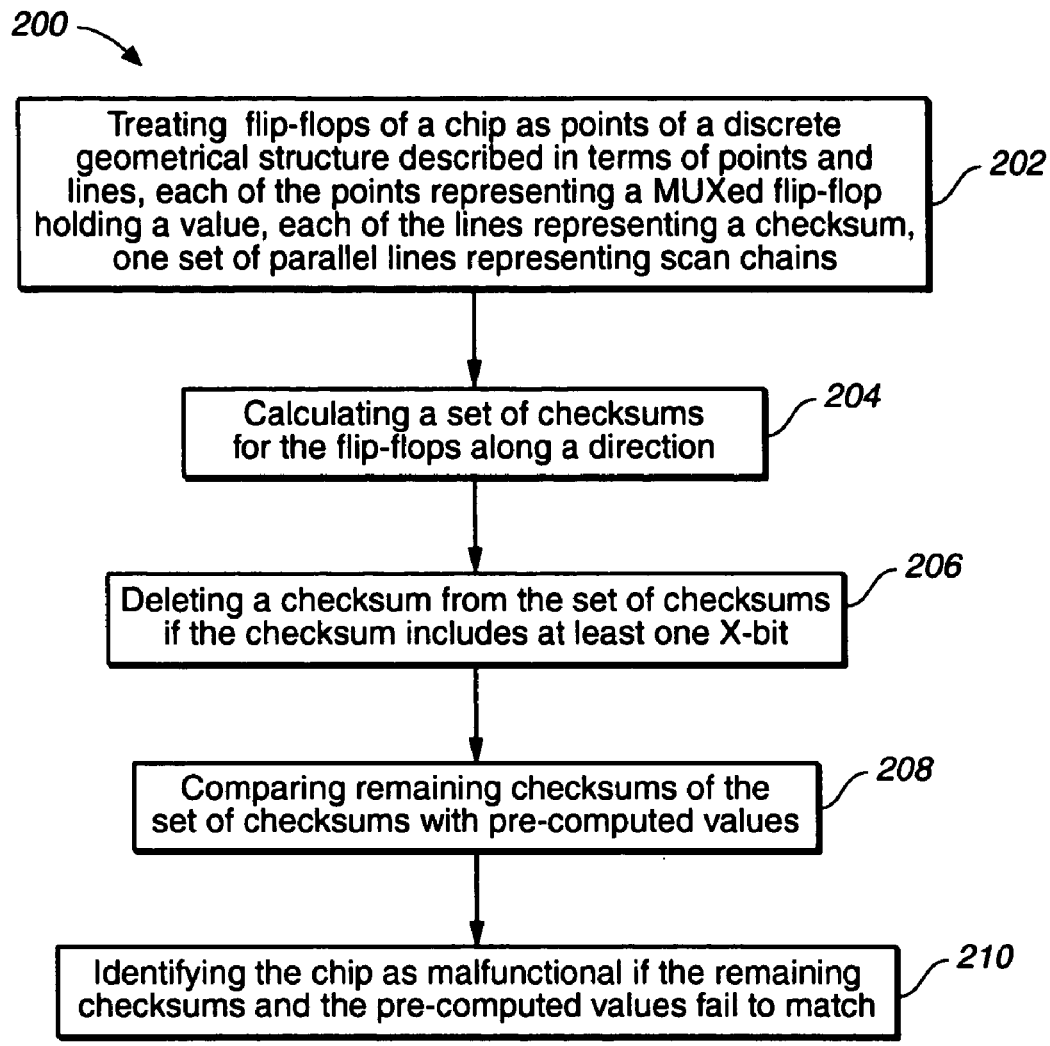
FIG._2

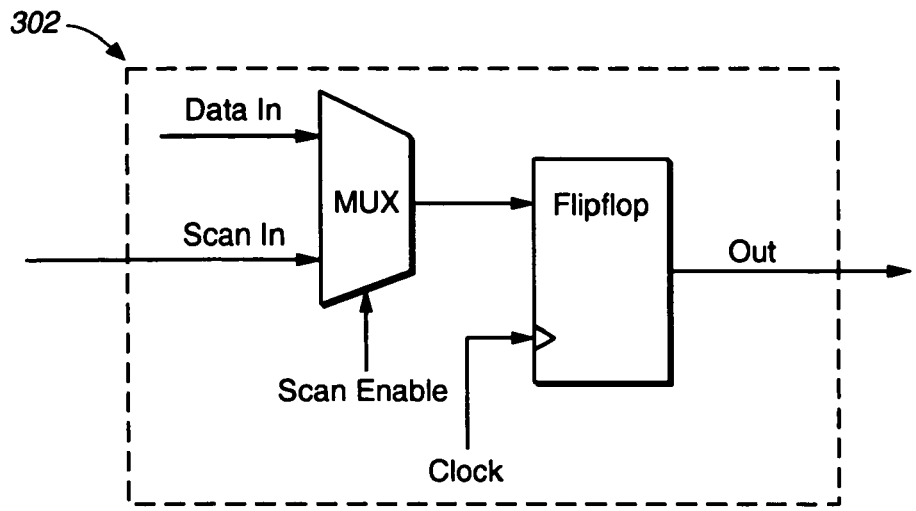
FIG._4
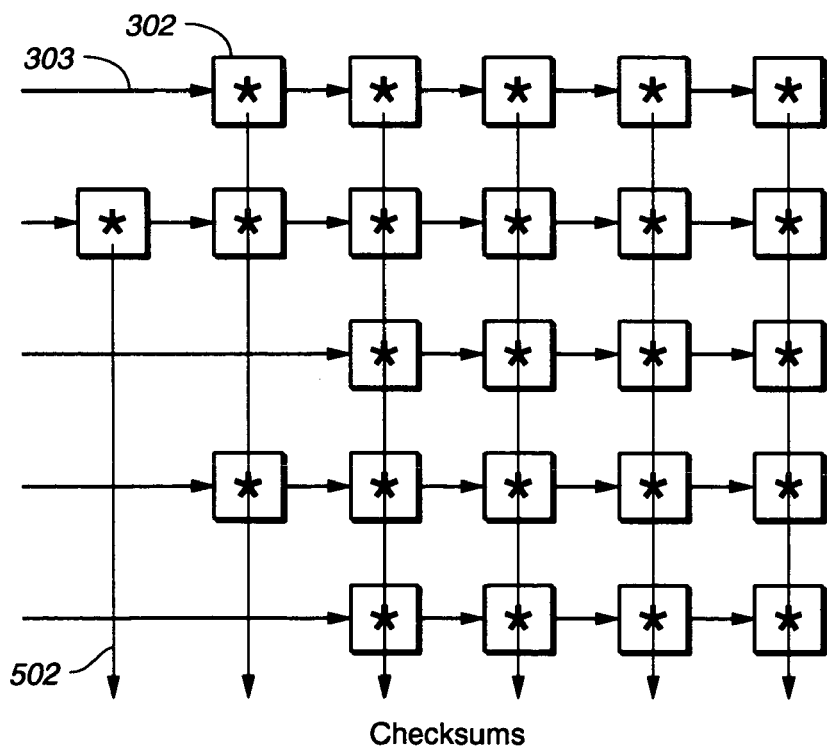
Checksums
FIG._5

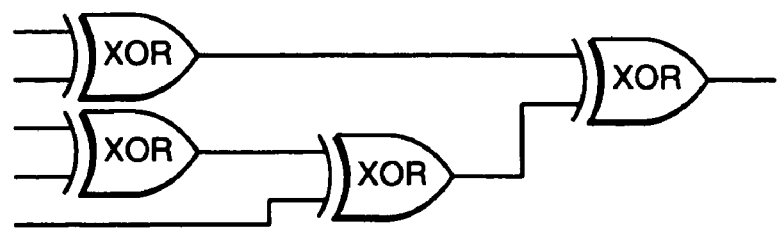
FIG._6
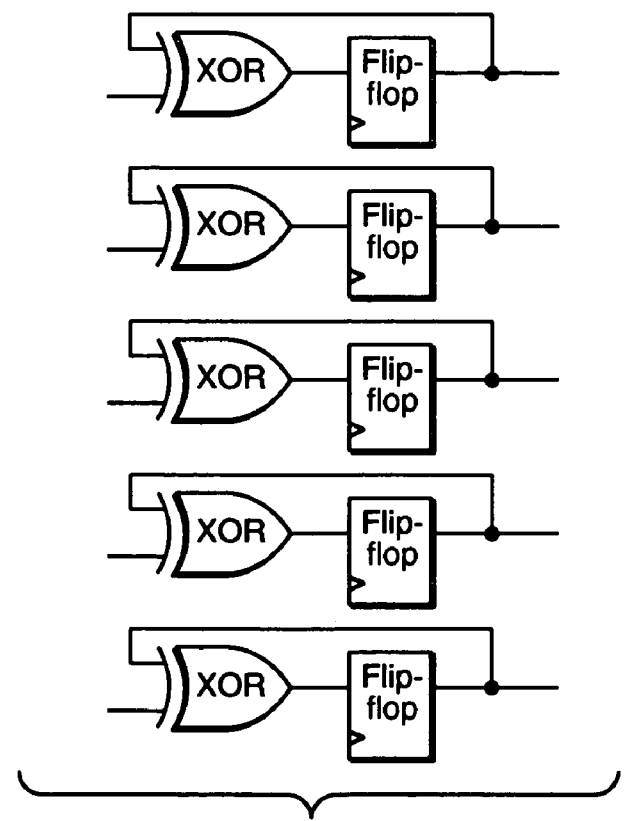
FIG._7

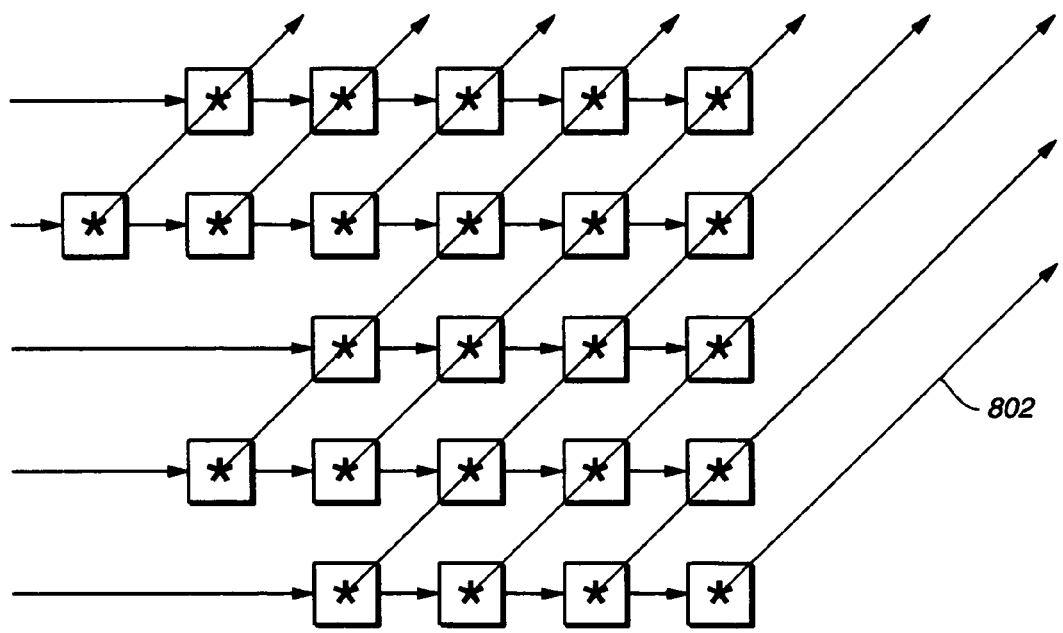
FIG._8
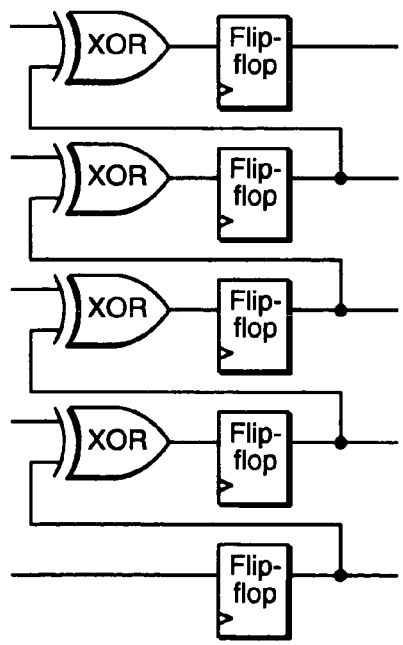
FIG._9

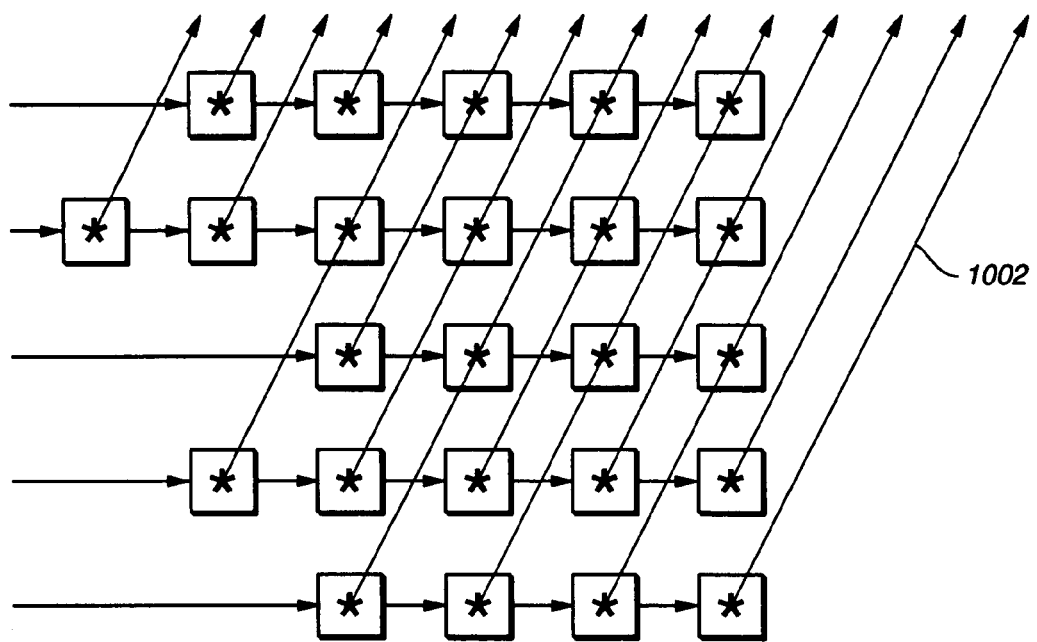
FIG._10
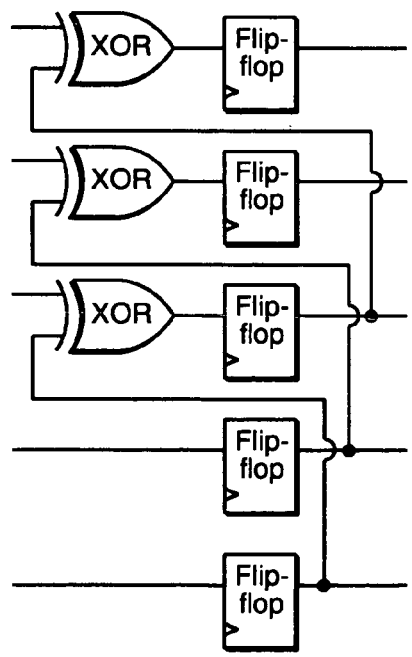
FIG._11

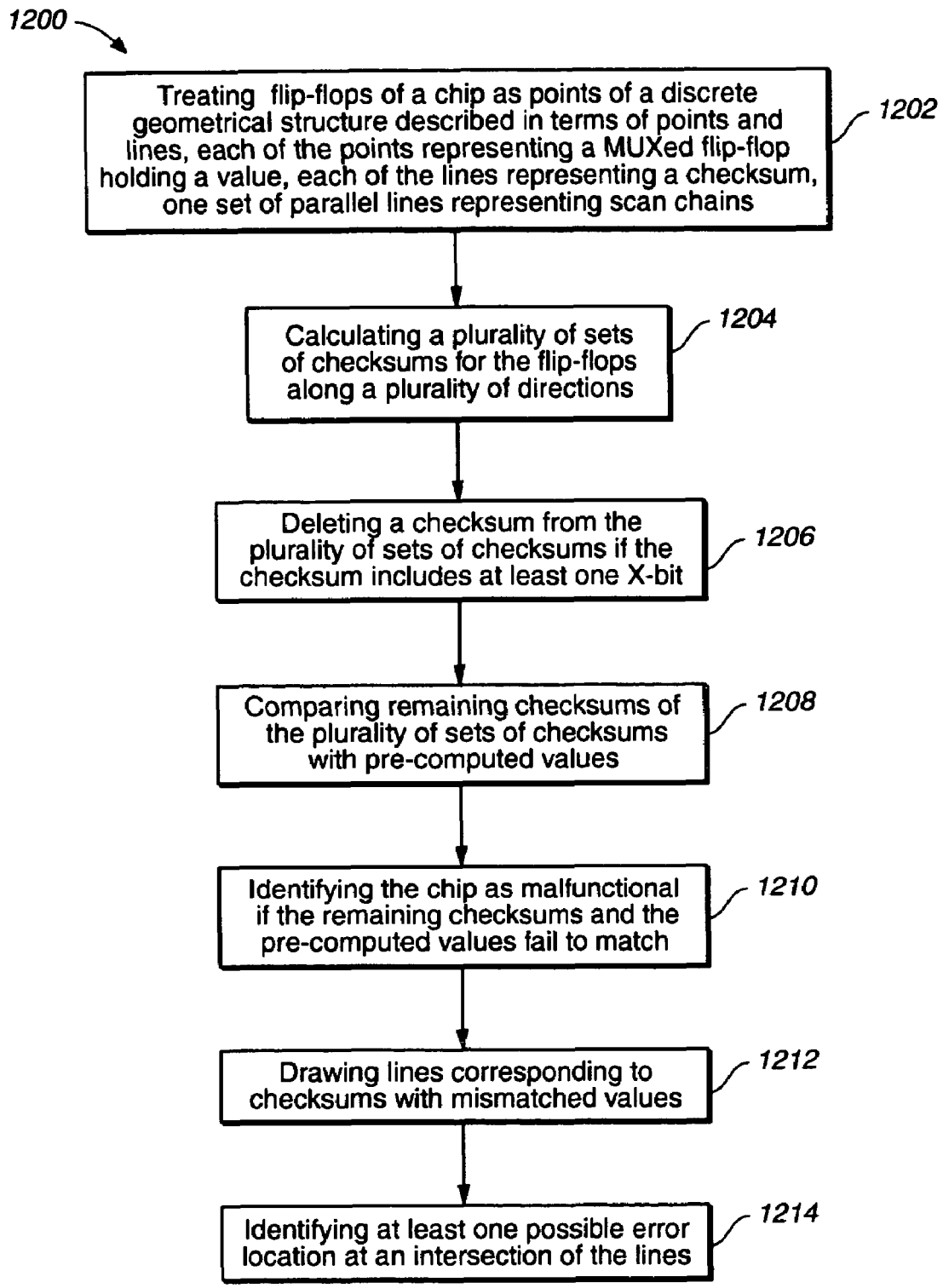
FIG._12

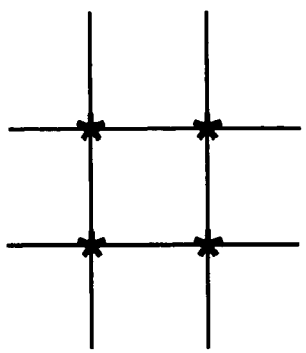
FIG._13
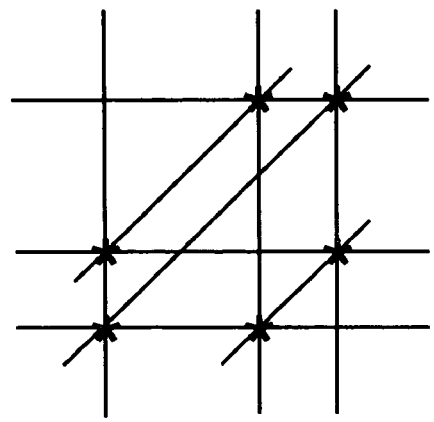
FIG._14
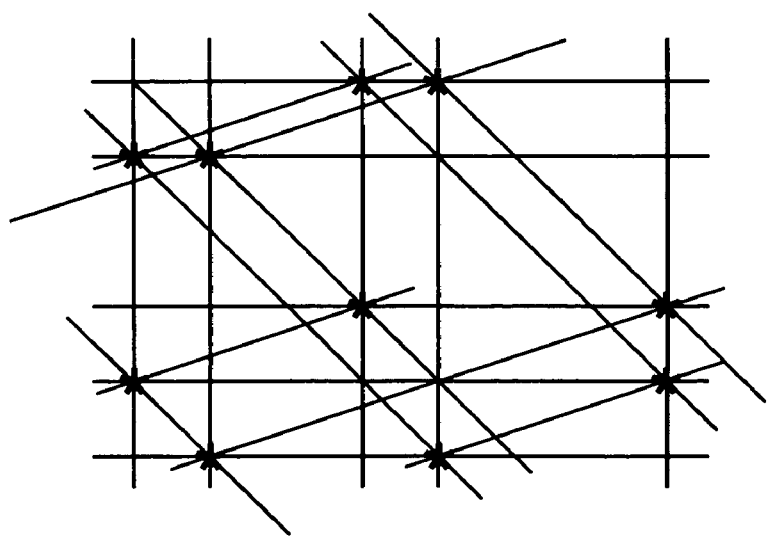
FIG._15

METHODS FOR USING CHECKSUMS IN X-TOLERANT TEST RESPONSE COMPACTION IN SCAN-BASED TESTING OF INTEGRATED CIRCUITS

FIELD OF THE INVENTION

The present invention generally relates to the field of integrated circuits, particularly to methods for using checksums in X-tolerant test response compaction in scan-based testing of integrated circuits.

BACKGROUND OF THE INVENTION

As integrated circuits are produced with greater and greater levels of circuit density, efficient testing schemes that guarantee very high fault coverage while minimizing test costs and chip area overhead have become essential. However, as the complexity of circuits continues to increase, high fault coverage of several types of fault models becomes more difficult to achieve with traditional testing paradigms. This difficulty arises for several reasons. First, larger integrated circuits have a very high and still increasing logic-to-pin ratio that creates a test data transfer bottleneck at the chip pins. In addition, larger circuits require a prohibitively large volume of test data that must be then stored in external testing equipment. Moreover, applying the test data to a large circuit requires an increasingly long test application time. Furthermore, present external testing equipment is unable to test such larger circuits at their speed of operation.

Integrated circuits are presently tested using a number of structured design for testability (DFT) techniques. These techniques rest on the general concept of making all or some state variables (memory elements like flip-flops and latches) directly controllable and observable. If this can be arranged, a circuit can be treated, as far as testing of combinational faults is concerned, as a combinational or a nearly combinational network. The most-often used DFT methodology is scan-based testing of integrated circuits (based on scan chains). It assumes that during testing all (or almost all) memory elements are connected into one or more shift registers. A circuit that has been designed for test has two modes of operation: a normal mode and a test, or scan, mode. In the normal mode, the memory elements perform their regular functions. In the scan mode, the memory elements become scan cells that are connected to form a number of shift registers called scan chains. These scan chains are used to shift a set of test patterns into the circuit and to shift out circuit, or test, responses to the test patterns. The test responses are then compared to fault-free responses to determine if the circuit under test works properly.

Some of the DFT techniques include compactors to compress the test responses from the scan chains. For a compaction method, bits stored in flip-flops have to be used. If a design has 1,000,000 flip-flops, then there are 1,000,000 input bits for the compactor. However, this does not mean that the compactor has so many inputs. Flip-flops are physically connected into scan chains. For example, the 1,000,000 flip-flops may be connected into 250 scan chains, each with 4,000 flip-flops. Thus, the compactor may have only 250 inputs, and 1,000,000 bits of information have to flow through these "ports" sequentially during 4,000 units of time (clock cycles). A general view of the compactor connected to scan chains is shown in FIG. 1. The compactor transforms these 1 million bits into a smaller amount of bits (e.g., 5,000 bits). That is, mathematically, the compactor computes a function having 1,000,000-bit argument and 5,000-bit value. These 5,000 bits (depending on implementation) may leave the compactor simultaneously (all together at the same moment), sequentially (one bit per clock cycle during 5,000 clock cycles) or under some other schedules (e.g., 10 bits per clock cycle, during 500 clock cycles). For various reasons, all practical implementations of compactors deal with very specific subclasses of above-mentioned functions. Namely, it is common practice to use functions such that each output bit is a sum (modulo 2) of some input bits (or the negation (inversion, complement) of the sum). This is why people describe compactors in terms of checksums, i.e. sums, computed for the purpose to check their inputs. Each practical particular implementation of compactors touches two parts of the problem: (i) how to choose checksums and how to build corresponding hardware in a design phase? and (ii) how to interpret values of checksums in a testing phase. In general, X-compaction technique deals with part (ii). It can be expressed as "if a checksum includes at least one X-valued bit, then the value of this checksum is not used." However, in a particular (conventional) implementation, the X-compaction technique deals with part (i) as well. Namely, a "standard" X-compactor computes checksums by combinational circuit (i.e. without memory). Thus, in the above example with 250 scan chains, each with 4,000 flip-flops, one possible implementation of "standard" X-compactor may use circuit (containing only XOR gates) with 250 inputs and 9 outputs. This compactor computes a function with 1,000,000 inputs and 36,000 (i.e., 4,000×9) outputs, where first 9 outputs depend only on first 250 inputs, next 9 outputs depend only on next 250 inputs, and so on. This compactor works well in average. However, in the case of 2 or more X-values (unknown values) in the same group of 250 inputs, it typically fails to detect errors in the same group.

Thus, it is desirable to provide new methods for organizing and computing checksums in X-tolerant test response compaction in scan-based testing of integrated circuits.

SUMMARY OF THE INVENTION

In an exemplary aspect, the present invention provides a method for organizing and using checksums in X-tolerant test response compaction in scan-based testing of integrated circuits. Flip-flops of a chip are treated as points of a discrete geometrical structure described in terms of points and lines (e.g., a two-dimensional structure, or the like). Each point represents a MUXed flip-flop holding a value. Each line (with points on it) represents a checksum: bit values of flip-flops corresponding to points on the line are all XORed (i.e., added) together. A set of all checksums ("lines") may be separated into subsets, where each subset contains parallel lines. One of these subsets (such that each point belongs to one of lines of the subset) represents scan chains, each line representing one scan chain. In a preferred embodiment, a compactor contains separate parts for each of these subsets such that complexity (the number of gates) of each part depends on the number of scan chains and does not depend on their lengths. Values of checksums may be used as follows. If a checksum includes at least one X-bit, the checksum is deleted from the set of calculated checksums. The remaining checksums of the set of calculated checksums are compared with pre-computed values. If the remaining checksums and the pre-computed values fail to match, then the chip is identified as malfunctional.

For the chip detected as malfunctional, the present invention additionally provides a method for locating error bits. Lines corresponding to checksums with mismatched values are drawn. Possible candidates for error locations are those identified as intersections of these lines. A point which is an intersection of a large number of lines marks a more probable error location.

It is to be understood that both the foregoing general description and the following detailed description are exemplary and explanatory only and are not restrictive of the invention as claimed. The accompanying drawings, which are incorporated in and constitute a part of the specification, illustrate an embodiment of the invention and together with the general description, serve to explain the principles of the invention.

BRIEF DESCRIPTION OF THE DRAWINGS

The numerous advantages of the present invention may be better understood by those skilled in the art by reference to the accompanying figures in which:

FIG. 1 is a schematic diagram illustrating a typical test response compactor;

FIG. 2 is a flow diagram of a method for organizing and using checksums in X-tolerant test response compaction in scan-based testing of integrated circuits in accordance with an exemplary embodiment of the present invention;

FIG. 3 is a schematic diagram illustrating that scan chains shown in FIG. 1 can be considered as a plurality of parallel horizontal line segments aligned to one end in accordance with an exemplary embodiment of the present invention;

FIG. 4 is a schematic diagram illustrating a parallel horizontal line segment shown in FIG. 3 in accordance with an exemplary embodiment of the present invention;

FIG. 5 is a schematic diagram illustrating that checksums are calculated for the plurality of parallel horizontal line segments shown in FIG. 3 along a vertical direction in accordance with an exemplary embodiment of the present invention;

FIG. 6 is a schematic diagram illustrating a standard XOR tree which may be used to calculate checksums along the vertical direction as shown in FIG. 5;

FIG. 7 is a schematic diagram illustrating one flip-flop and one XOR gate per scan chain are used to calculate checksums for the plurality of parallel horizontal line segments shown in FIG. 3 along a horizontal direction in accordance with an exemplary embodiment of the present invention;

FIG. 8 is a schematic diagram illustrating that checksums are calculated for the plurality of parallel horizontal line segments shown in FIG. 3 along a diagonal direction in accordance with an exemplary embodiment of the present invention;

FIG. 9 is a schematic diagram illustrating a shift register which may be used to calculate checksums along the diagonal direction as shown in FIG. 8;

FIG. 10 is a schematic diagram illustrating that checksums are calculated for the plurality of parallel horizontal line segments shown in FIG. 3 along a diagonal direction in accordance with an additional exemplary embodiment of the present invention;

FIG. 11 is a schematic diagram illustrating pairs of intermixed shift registers which may be used to calculate checksums along the diagonal direction as shown in FIG. 10;

FIG. 12 is a flow diagram of a method for using checksums in X-tolerant test response compaction in scan-based testing of integrated circuits in accordance with an additional exemplary embodiment of the present invention;

FIG. 13 is a geometrical illustration that any two sets of parallel lines give a code distance of 4;

FIG. 14 is a geometrical illustration that any three sets of parallel lines give a code distance of 6; and FIG. 15 is a geometrical illustration that almost any four sets of parallel lines give a code distance of 10.

DETAILED DESCRIPTION OF THE INVENTION

Reference will now be made in detail to the presently preferred embodiments of the invention, examples of which are illustrated in the accompanying drawings.

The present invention provides new and easy-to-implement (in terms of both chip design complexity and hardware size) methods for the test response compactor. The present invention uses geometrical (e.g., 2-dimensional) representation of data to be compacted and computes checksums along some predefined directions. The present invention addresses the foregoing-described hardware part (i.e., part (i)). Resulting netlists may be used both in X-compaction technique and in more general interpretation of compactor's output information. Regarding the foregoing-described part (ii), the present invention describes usage both inside and outside X-compaction paradigm.

FIG. 1 is a schematic diagram illustrating a compactor being used to reduce a size of scan response. FIG. 2 is a flow diagram of a method 200 for designing and using checksums in X-tolerant test response compaction in scan-based testing of integrated circuits in accordance with an exemplary embodiment of the present invention. At step 200, flip-flops of a chip are treated during a chip design phase as points of a discrete geometrical structure described in terms of points and lines (e.g., a two-dimensional structure, or the like). Each point represents a MUXed flip-flop holding a value (e.g., 1, 0, or X-bit). An X-bit is a bit whose value is unknown. Each line (with points on it) represents a checksum: bit values of flip-flops corresponding to points on the line are all added together. Throughout the present invention, the term "sum", "addition", "to add" and the like refer to operation "exclusive OR" (XOR) when applied to bit values. A set of all checksums ("lines") may be separated into subsets, where each subset contains parallel lines. One of these subsets (such that each point belongs to one of lines of the subset) represents scan chains, each line representing one scan chain. In a preferred embodiment, a compactor contains separate parts for each of these subsets such that complexity (the number of gates) of each part depends on the number of scan chains and does not depend on their lengths.

FIG. 3 is a schematic diagram illustrating that scan chains shown in FIG. 1 can be considered as a plurality of MUXed flip-flops 302 organized in rows and columns, where each row represents a scan chain (e.g., a scan chain 301 includes the flip-flops 302 interconnected serially from left to right), and these rows are aligned to the right end (i.e., there is the same distance between the compactor and each of the flip-flops from the same column). FIG. 4 is a schematic diagram illustrating a MUXed flip-flop 302 shown in FIG. 3 in accordance with an exemplary embodiment of the present invention, where the MUXed flip-flop 302 is used for scan data transfer.

Referring back to FIG. 2, a set of checksums is calculated along a direction 204. A horizontal direction is a direction in which flip-flops of a scan chain are interconnected serially (see, e.g., a direction 303 shown in FIG. 5). A vertical direction is a direction at a right angle to the horizontal direction (see, e.g., a direction 502 shown in FIG. 5) such that lines drawn along the vertical direction connect flip-flops with the same positions from outputs of scan chains. A diagonal direction is a direction which is neither the horizontal direction nor the vertical direction (see, e.g., directions 802 and 1002 shown in FIGS. 8 and 10, respectively). To compute the checksum along the vertical direction (see, e.g., FIG. 5), an XOR tree may be used (see, e.g., FIG. 6). To compute the checksum along the horizontal direction (i.e., sums of states from flip-flops in each scan chain separately), one flip-flop and one XOR gate per scan chain may be used (see, e.g., FIG. 7), where output values are read once after shifting all data from scan chains to these flip-flops. To compute the checksum along a diagonal direction (see, e.g., FIG. 8), a shift register (see, e.g., FIG. 9) may be used. To compute the checksum along a "more vertical" diagonal direction (see, e.g., FIG. 10), pairs of intermixed shift registers (see, e.g., FIG. 11) may be used.

Referring back to FIG. 2, if a checksum includes at least one X-bit, the checksum is deleted from the set of calculated checksums 206. The remaining checksums of the set of calculated checksums are compared with pre-computed values 208. If the remaining checksums and the pre-computed values fail to match, then the chip is identified as malfunctional 210.

Referring now to FIG. 12, a flow diagram of a method 1200 for using checksums in X-tolerant test response compaction in scan-based testing of integrated circuits in accordance with an additional exemplary embodiment of the present invention is shown. At step 1202, flip-flops of a chip are treated as points of a discrete geometrical structure described in terms of points and lines (e.g., a two-dimensional structure, or the like). Each point represents a MUXed flip-flop holding a value (e.g., 1, 0, or X-bit) (see., e.g., FIGS. 3 and 4). An X-bit is a bit whose value is unknown. Each line (with points on it) represents a checksum: bit values of flip-flops corresponding to points on the line are all added together. A set of all checksums ("lines") may be separated into subsets, where each subset contains parallel lines. One of these subsets (such that each point belongs to one of lines of the subset) represents scan chains, each line representing one scan chain. In a preferred embodiment, a compactor contains separate parts for each of these subsets such that complexity (the number of gates) of each part depends on the number of scan chains and does not depend on their lengths. A plurality of sets of checksums is calculated along a plurality of directions 1204. The plurality of directions may be any combination of a horizontal direction, a vertical direction, and/or a diagonal direction. For example, the plurality of directions may include a horizontal direction and a vertical direction, or include a horizontal direction and one or more diagonal directions, or include a vertical direction and one or more diagonal directions, or include a horizontal direction, a vertical direction and one or more diagonal directions. To compute the checksum along the vertical direction (see, e.g., FIG. 5), an XOR tree may be used (see, e.g., FIG. 6). To compute the checksum along the horizontal direction (i.e., sums of states from flip-flops in each scan chain separately), one flip-flop and one XOR gate per scan chain may be used (see, e.g., FIG. 7), where output values are read once after shifting all data from scan chains to these flip-flops. To compute the checksum along a diagonal direction (see, e.g., FIG. 8), a shift register (see, e.g., FIG. 9) may be used. To compute the checksum along a "more vertical" diagonal direction (see, e.g., FIG. 10), pairs of intermixed shift registers (see, e.g., FIG. 11) may be used.

Referring back to FIG. 12, if a checksum includes at least one X-bit, the checksum is deleted from the calculated plurality of sets of checksums 1206. The remaining checksums of the calculated plurality of sets of checksums are compared with pre-computed values 1208. If the remaining checksums and the pre-computed values fail to match, the chip is identified as malfunctional 1210.

The method 1200 shown in FIG. 12 may be used for detecting locations of errors in malfucntional chips: if all "wrong" (i.e., with mismatched values) checksums are known, then fault points are probably located at intersections of corresponding lines. Starting with intersections of a maximum number of lines, one may iteratively restore most of these fault points. This is shown in FIG. 12. Lines corresponding to checksums with mismatched values are drawn 1212. At least one error location is identified at an intersection of the lines 1214.

The present invention provides a method for organizing checksums which may also be used in a general error-detection paradigm, which is not limited to the one that follows X-compaction limitations. That is, checksums with X-terms may be used instead of being ignored. Suppose the same input bit q participates in sums S1, S2, S3 . . . (S1=q XOR R1, S2=q XOR R2, S3=q XOR R3 . . . , where R1, R2, R3 . . . are the remaining terms). When q is X-bit, in X-compaction all these S1, S2, S3 . . . are thrown away. However, values S1 XOR S2, S1 XOR S3, S2 XOR S3 etc. are still full of information because unknown terms "q" are mutually compensating each other (in absence of X-bits, there are no differences in paradigms). The present system of checksums may correspond to the code with a big code distance. Generally, when mapping F from a finite set A to a set of vectors B (named code vectors), the code distance d(F) is the minimum distance between F(a1) and F(a2) over all distinct a1 and a2 from A. Sometimes only the set of code vectors is analyzed, where the code distance equals the minimum distance between elements of this set. In both cases, the distance between vectors is measured as the number of distinct corresponding elements of these vectors (this distance is typically named Hamming distance). For example, in case of one set of parallel lines, the code distance is 2 (the case of detecting of 1 error) because two errors along the same line may compensate each other and became "invisible" from outside. Any two sets of parallel lines give a code distance of 4 (detection of any A errors in presence of B X-values, if A+B<4): minimal configuration of self-compensating errors is shown in FIG. 13. Any three sets of parallel lines give a code distance of 6 (detection of any A errors in presence of B X-values, if A+B<6): minimal configuration of self-compensating errors is shown on FIG. 14. Any four sets of parallel lines give a code distance of at least 8, but there are 4-set configurations with a distance of 10 (detection of any A errors in presence of B X-values, if A+B<10): minimal configuration of self-compensating errors is shown on FIG. 15. In general, a system of checksums with a code distance D enables detecting of any A errors in presence of B X-values if A+B<D, or allows finding locations of any A errors in presence of B X-values if 2A+B<D. Note that a code distance shows the most pessimistic case; sometimes algorithms for detecting and localizing errors (like ones of the present invention) can still work even if there are more errors than D−B (for detecting) or (D−B)/2 (for localizing).

The present invention may have the following advantages. First, it is easy to implement (in terms of both chip design complexity and hardware size). Moreover, the present invention may provide a good compression ratio. Further, in most cases, error bits may be easily located. If the lines corresponding to checksums with unexpected (or mismatched) values are drawn, then errors are most probably located at intersections of these lines. Additionally, the code distance may be made as large as necessary (when one maps input vectors I into output vectors O=f(I) (in the present case these are values of checksums), then the code distance is the minimum possible number of differences between non-equal input vectors I1 and I2 producing the same output: f(I1)=f(I2). A large code distance may guarantee that multiple errors will not "compensate" each other). Moreover, the present invention ensures that no pair of flip-flops belong to two or more checksums simultaneously (i.e., an X-bit may not destroy more than one checksum for any other bit), because two distinct lines cannot have more than one intersection point. Further, the present checksums are computed by simple circuits (e.g., shift registers) that enable efficient placement and routing.

The methods above are described on the base of classical planar geometry on infinite plane, but other geometries may also be useful. Among them, an important case is toroidal geometry with the following discrete finite model:

let P be a prime number;

let points be represented as pairs (x,y) where x and y are integers between 0 and P−1; and let lines be defined as sets of points satisfying Ax+By+C=0 (mod P), where coefficients A,B,C are integers between 0 and P−1 such that A and/or B does not equal to 0 (if A=0, line is horizontal; if B=0, line is vertical; if both A and B are non-zero, line is diagonal).

Hardware implementation for this toroidal model is almost identical to the one described above: implementation of "horizontal" and "vertical" sets of checksums is the same; each "diagonal" set of checksums may be implemented by P-bit cyclical shift register.

The above-described "planar" implementations work most effectively if the total number of X-bits and errors is such that an "average" checksum has a few of them. If there are too many X-bits and/or errors, it is necessary to use shorter checksums: a model of lines in K-dimensional space (K>2) may be used. If there are too few X-bits and errors, one may use, say, a model of K-dimensional space with (K−1)-dimensional subspaces for checksums.

It is to be noted that the foregoing described embodiments according to the present invention may be conveniently implemented using conventional general purpose digital computers programmed according to the teachings of the present specification, as will be apparent to those skilled in the computer art. Appropriate software coding may readily be prepared by skilled programmers based on the teachings of the present disclosure, as will be apparent to those skilled in the software art.

It is to be understood that the present invention may be conveniently implemented in forms of a software package. Such a software package may be a computer program product which employs a computer-readable storage medium including stored computer code which is used to program a computer to perform the disclosed function and process of the present invention. The computer-readable medium may include, but is not limited to, any type of conventional floppy disk, optical disk, CD-ROM, magneto-optical disk, ROM, RAM, EPROM, EEPROM, magnetic or optical card, or any other suitable media for storing electronic instructions.

It is understood that the specific order or hierarchy of steps in the processes disclosed is an example of exemplary approaches. Based upon design preferences, it is understood that the specific order or hierarchy of steps in the processes may be rearranged while remaining within the scope of the present invention. The accompanying method claims present elements of the various steps in a sample order, and are not meant to be limited to the specific order or hierarchy presented.

It is believed that the present invention and many of its attendant advantages will be understood by the foregoing description. It is also believed that it will be apparent that various changes may be made in the form, construction and arrangement of the components thereof without departing from the scope and spirit of the invention or without sacrificing all of its material advantages. The form herein before described being merely an explanatory embodiment thereof, it is the intention of the following claims to encompass and include such changes.

What is claimed is:

1. A method for using checksums in X-tolerant test response compaction in scan-based testing of integrated circuits, comprising:

treating flip-flops of a chip as points of a discrete geometrical structure described in terms of points and lines, each of said points representing a MUXed flip-flop holding a value, each of said lines representing a checksum, one set of parallel lines representing scan chains; and calculating a set of checksums for said flip-flops along a direction selected from the group consisting of vertical and diagonal.

2. The method of claim 1, further comprising:

deleting a checksum from said set of checksums if said checksum includes at least one X-bit;

comparing remaining checksums of said set of checksums with pre-computed values; and identifying said chip as malfunctional if said remaining checksums and said pre-computed values fail to match.

3. The method of claim 1, one flip-flop and one XOR gate are used to calculate each of said set of checksums.

4. The method of claim 1, wherein an XOR tree is used to calculate each of said set of checksums.

5. The method of claim 1, wherein a shift register or a group of two or more intermixed shift registers is used to calculate each of said set of checksums.

6. A method for using checksums in X-tolerant test response compaction in scan-based testing of integrated circuits, comprising:

treating flip-flops of a chip as points of a discrete geometrical structure described in terms of points and lines, each of said points representing a MUXed flip-flop holding a value, each of said lines representing a checksum, one set of parallel lines representing scan chains; and calculating a plurality of sets of checksums for said flip-flops along a plurality of directions.

7. The method of claim 6, further comprising:

deleting a checksum from said plurality of sets of checksums if said checksum includes at least one X-bit;

comparing remaining checksums of said plurality of sets of checksums with pre-computed values; and identifying said chip as malfunctional if said remaining checksums and said pre-computed values fail to match.

8. The method of claim 7, further comprising:

drawing lines corresponding to checksums with mismatched values; and identifying at least one error location at an intersection of said lines.

9. The method of claim 6, wherein said plurality of directions includes at least one of a horizontal direction, a vertical direction, or a diagonal direction.

10. The method of claim 9, wherein for a horizontal direction, one flip-flop and one XOR gate are used to calculate checksums along said horizontal direction.

11. The method of claim 9, wherein for a vertical direction, an XOR tree is used to calculate checksums along said vertical direction.

12. The method of claim 9, wherein for a diagonal direction, a shift register or a group of two or more intermixed shift registers is used to calculate checksums along said diagonal direction.

13. A computer-readable medium having computer-executable instructions for performing a method for using checksums in X-tolerant test response compaction in scan-based testing of integrated circuits, said method comprising:

treating flip-flops of a chip as points of a discrete geometrical structure described in terms of points and lines, each of said points representing a MUXed flip-flop holding a value, each of said lines representing a checksum, one set of parallel lines representing scan chains; and calculating a set of checksums for said flip-flops along a direction selected from the group consisting of vertical and diagonal.

14. The computer-readable medium of claim 13, wherein said method further comprising:

deleting a checksum from said set of checksums if said checksum includes at least one X-bit;

comparing remaining checksums of said set of checksums with pre-computed values; and identifying said chip as malfunctional if said remaining checksums and said pre-computed values fail to match.

15. The computer-readable medium of claim 13, wherein one flip-flop and one XOR gate are used to calculate each of said set of checksums.

16. The computer-readable medium of claim 13, wherein an XOR tree is used to calculate each of said set of checksums.

17. The computer-readable medium of claim 13, wherein a shift register or a group of two or more intermixed shift registers is used to calculate each of said set of checksums.

18. A computer-readable medium having computer-executable instructions for performing a method for using checksums in X-tolerant test response compaction in scan-based testing of integrated circuits, said method comprising:

treating flip-flops of a chip as points of a discrete geometrical structure described in terms of points and lines, each of said points representing a MUXed flip-flop holding a value, each of said lines representing a checksum, one set of parallel lines representing scan chains; and calculating a plurality of sets of checksums for said flip-flops along a plurality of directions.

19. The computer-readable medium of claim 18, wherein said method further comprising:

deleting a checksum from said plurality of sets of checksums if said checksum includes at least one X-bit;

comparing remaining checksums of said plurality of sets of checksums with pre-computed values; and identifying said chip as malfunctional if said remaining checksums and said pre-computed values fail to match.

20. The computer-readable medium of claim 19, wherein said method further comprising:

drawing lines corresponding to checksums with mismatched values; and identifying at least one error location at an intersection of said lines.

21. The computer-readable medium of claim 18, wherein said plurality of directions includes at least one of a horizontal direction, a vertical direction, or a diagonal direction.

22. The computer-readable medium of claim 21, wherein for a horizontal direction, one flip-flop and one XOR gate are used to calculate checksums along said horizontal direction.

23. The computer-readable medium of claim 21, wherein for a vertical direction, an XOR tree is used to calculate checksums along said vertical direction.

24. The computer-readable medium of claim 21, wherein for a diagonal direction, a shift register or a group of two or more intermixed shift registers is used to calculate checksums along said diagonal direction.

\* \* \* \* \*